United States Patent
Perel et al.

(10) Patent No.: US 11,251,010 B1
(45) Date of Patent: Feb. 15, 2022

(54) SHAPED REPELLER FOR AN INDIRECTLY HEATED CATHODE ION SOURCE

(71) Applicant: Applied Materials, Inc., Santa Clara, CA (US)

(72) Inventors: Alexander S. Perel, Danvers, MA (US); Jay S. Johnson, Gloucester, MA (US); Suren Madunts, Peabody, MA (US); Adam M. McLaughlin, Merrimac, MA (US); Graham Wright, Newburyport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/443,684

(22) Filed: Jul. 27, 2021

(51) Int. Cl.
*H01J 3/14* (2006.01)
*H01J 1/02* (2006.01)

(52) U.S. Cl.
CPC . *H01J 3/14* (2013.01); *H01J 1/02* (2013.01); *H01J 2201/19* (2013.01)

(58) Field of Classification Search
CPC ...... H01J 1/22; H01J 1/28; H01J 11/28; H01J 27/024; H01J 27/14; H01J 27/205; H01J 37/04; H01J 37/08; H01J 37/32541; H01J 37/3417; H01J 37/3423
See application file for complete search history.

(56) References Cited

U.S. PATENT DOCUMENTS 10,854,416 B1 * 12/2020 McLaughlin ......... H01J 27/022
2021/0074503 A1    3/2021 McLaughlin et al.

* cited by examiner

*Primary Examiner* — Anne M Hines
(74) *Attorney, Agent, or Firm* — Nields, Lemack & Frame, LLC

(57) ABSTRACT

A system for extending the life of a repeller in an IHC ion source is disclosed. The system includes an IHC ion source wherein the back surface of the repeller has been shaped to reduce the possibility of electrical shorts. The separation distance between the back surface of the repeller and the chamber wall behind the repeller is increased along its outer edge, as compared to the separation distance near the center of the repeller. This separation distance reduces the possibility that deposited material will flake and short the repeller to the chamber wall. Further, in certain embodiments, the separation distance between the back surface of the repeller and the chamber wall near the center of the repeller is unchanged, so as to minimize the flow of gas that exits from the chamber. The back surface of the repeller may be tapered, stepped or arced to achieve these criteria.

18 Claims, 5 Drawing Sheets

SHAPED REPELLER FOR AN INDIRECTLY HEATED CATHODE ION SOURCE

This disclosure describes systems for extending repeller life in an ion source, and more particularly, shaping the back surface of the repeller to reduce the possibility of electrical shorting.

BACKGROUND

Semiconductor devices are fabricated using a plurality of processes, some of which implant ions into the workpiece. One mechanism that may be used to create the ions is an indirectly heated cathode (IHC) ion source. An IHC ion source comprises a filament disposed behind a cathode. The cathode may be maintained at a more positive voltage than the filament. As current is passed through the filament, the filament emits thermionic electrons, which are accelerated toward the more positively charged cathode. These thermionic electrons serve to heat the cathode, in turn causing the cathode to emit electrons into the chamber of the ion source. The cathode is disposed at one end of a chamber. A repeller is typically disposed on the second end of the chamber opposite the cathode. The repeller may be maintained at a different voltage than the chamber walls or electrically floating.

Over time, material from the repeller may be deposited on the surface behind the repeller in the ion source chamber. As this deposited material grows thicker, it may begin to flake. This flaked material may allow electrical contact between the repeller and the surface behind the repeller, causing a short circuit. This phenomenon affects the lifetime of the ion source.

Therefore, it would be beneficial if there was a repeller that could extend the life of the ion source by reducing the possibility of electrical shorting near the repeller. Further, it would be advantageous if this system could be readily adopted for existing IHC ion sources.

SUMMARY

A system for extending the life of a repeller in an IHC ion source is disclosed. The system includes an IHC ion source wherein the back surface of the repeller has been shaped to reduce the possibility of electrical shorts. The separation distance between the back surface of the repeller and the chamber wall behind the repeller is increased along its outer edge, as compared to the separation distance near the center of the repeller. This separation distance reduces the possibility that deposited material will flake and short the repeller to the chamber wall. Further, in certain embodiments, the separation distance between the back surface of the repeller and the chamber wall near the center of the repeller is unchanged, so as to minimize the flow of gas that exits from the chamber. The back surface of the repeller may be tapered, stepped or arced to achieve these criteria.

According to one embodiment, an ion source is disclosed. The ion source comprises a chamber comprising a plurality of walls; a cathode disposed on one end of the chamber; a repeller disposed on a second end of the chamber, the repeller comprising a repeller stem passing through an opening in the second end, and a repeller head disposed within the chamber and attached to the repeller stem; wherein a back surface of the repeller head has a dome shape. In certain embodiments, the minimum distance between the back surface and a surface behind the repeller head is 0.05 inches or less. In some embodiments, an outer separation distance between the back surface of the repeller head and a surface behind the repeller head measured along an outer edge of the repeller head is greater than the minimum distance by at least 0.100 inches. In certain embodiments, the outer separation distance is greater than the minimum distance by at least 0.150 inches. In some embodiments, a liner is disposed between the repeller head and the second end, and the minimum distance and the outer separation distance are measured from the back surface of the repeller head to an exposed surface of the liner. In certain embodiments, a gap is defined between the repeller stem and the opening, and wherein a minimum distance between the back surface and a surface behind the repeller head is less than or equal to a width of the gap. In some embodiments, a middle separation distance is defined as a distance between a back surface of the repeller head and a surface behind the repeller head at a location that is a midpoint between an outer edge of the repeller head and an outer edge of the opening; and the middle separation distance is at least 75% greater than a minimum distance between the back surface of the repeller head and the surface behind the repeller head.

According to another embodiment, an ion source is disclosed. The ion source comprises a chamber comprising a plurality of walls; a cathode disposed on one end of the chamber; a repeller disposed on a second end of the chamber, the repeller comprising a repeller stem passing through an opening in the second end, and a repeller head disposed within the chamber and attached to the repeller stem; wherein a back surface of the repeller head is shaped such that an outer separation distance between the back surface of the repeller head and a surface behind the repeller head measured along an outer edge of the repeller head is greater than an inner separation distance between the back surface of the repeller head and the surface behind the repeller head measured at the center of the repeller head. In certain embodiments, the back surface is tapered. In some embodiments, the back surface is stepped. In certain embodiments, the back surface is dome shaped. In some embodiments, the outer separation distance is at least 0.100 inches greater than the inner separation distance. In some embodiments, the outer separation distance is at least 0.150 inches greater than the inner separation distance. In certain embodiments, a liner is disposed between the repeller head and the second end, and the inner separation distance and the outer separation distance are measured from the back surface of the repeller head to an exposed surface of the liner. In some embodiments, the inner separation distance is a minimum distance between the back surface of the repeller head and the surface behind the repeller head. In certain embodiments, a gap is defined between the repeller stem and the opening, and wherein the inner separation distance is less than or equal to a width of the gap. In some embodiments, a middle separation distance is defined as a distance between the back surface of the repeller head and the surface behind the repeller head at a location that is a midpoint between the outer edge of the repeller head and an outer edge of the opening; and the middle separation distance is at least 75% greater than the inner separation distance.

According to another embodiment, a repeller for use in an ion source is disclosed. The repeller comprises a repeller stem; and a repeller head having a diameter larger than the repeller stem, and attached to the repeller stem; wherein a back surface of the repeller head has a dome shape.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
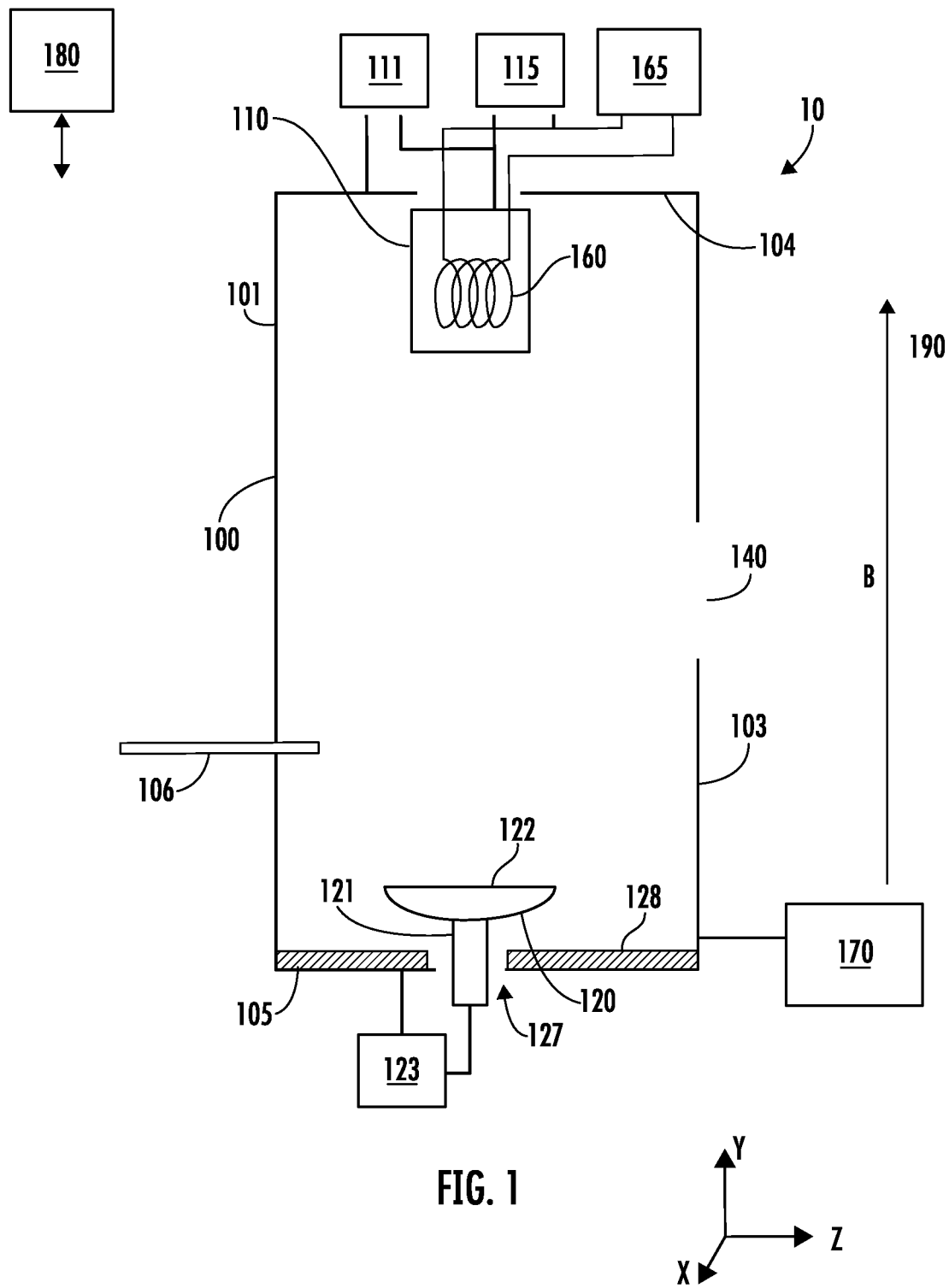
FIG. 1 is a block diagram showing an IHC ion source according to one embodiment.

FIG. 1 shows an IHC ion source 10 that overcomes these issues. The IHC ion source 10 includes a chamber 100, comprising two opposite ends, a first end 104 and a second end 105, and walls 101 connecting to these two ends. These walls 101 include side walls, an extraction plate 103 and a bottom wall opposite the extraction plate 103. The extraction plate 103 includes an extraction aperture 140 through which ions are extracted. The walls 101 and ends of the chamber 100 may be constructed of an electrically conductive material and may be in electrical communication with one another. A cathode 110 is disposed in the chamber 100 at a first end 104 of the chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons from its front surface into chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. The cathode 110 is in communication with an arc voltage power supply 111. The arc voltage power supply 111 supplies a voltage to the cathode relative to the chamber 100. This arc voltage accelerates the thermionic electrons emitted at the cathode into arc chamber to ionize the neutral gas. The current drawn by this arc voltage power supply 111 is a measurement of the amount of current being driven through the plasma. In certain embodiments, the walls 101 provide the ground reference for the other power supplies.

A repeller 120 is disposed in the chamber 100 on the second end 105 of the chamber 100 opposite the cathode 110. The repeller 120 may be constructed from tungsten, although other materials may be used. The repeller 120 may include a repeller stem 121 and a repeller head 122. The repeller stem 121 passes through an opening 127 in the second end 105 of the chamber 100. The diameter of the opening 127 is larger than the diameter of the repeller stem 121. Further, there may be a gap between the repeller stem 121 and the inner diameter of the opening 127 to minimize the risk of arcing. In certain embodiments, the radius of the opening 127 may be about 0.05 inches larger than the radius of the repeller stem 121. In certain embodiments, this difference in radii is kept as small as feasible without arcing, as gas from within the chamber 100 may escape through the gap between the repeller stem 121 and the opening 127.

The repeller head 122 has a diameter greater than the diameter of the repeller stem 121. In certain embodiments, the repeller head 122 may have a diameter of between 0.60 and 1.00 inches. The repeller 120 may be in electrical communication with a repeller power supply 123. In other embodiments, the repeller 120 may be electrically floating, wherein the repeller 120 is not connected to any power supply or to ground. In other embodiments, the repeller 120 may be connected to the arc voltage power supply 111.

As the name suggests, the repeller 120 serves to repel the electrons emitted from the cathode 110 back toward the center of the chamber 100. For example, in certain embodiments, the repeller 120 may be biased at a negative voltage relative to the chamber 100 to repel the electrons. For example, in certain embodiments, the repeller 120 is biased at between 0 and −150V relative to the chamber 100.

In some embodiments, a liner 128 may be disposed on the second end 105. The liner 128 may be made of tungsten or another suitable material. In other embodiments, a liner 128 is not used. The liner 128 has an exposed surface that is exposed to the interior of the chamber 100 and a hidden surface that faces the second end 105.

In certain embodiments, a magnetic field 190 is generated in the chamber 100. This magnetic field is intended to confine the electrons along one direction. The magnetic field 190 typically runs parallel to the walls 101 from the first end 104 to the second end 105. For example, electrons may be confined in a column that is parallel to the direction from the cathode 110 to the repeller 120 (i.e. the y direction). Thus, electrons do not experience electromagnetic force to move in the y direction. However, movement of the electrons in other directions may experience an electromagnetic force.

One or more gasses may enter the chamber 100 via a gas inlet 106.

An extraction power supply 170 may be used to bias the IHC ion source 10 relative to the rest of the components in the beam line. For example, the platen 260 (see FIG. 2) may be at a first voltage, such as ground, while a positive voltage is applied to the IHC ion source 10 such that the IHC ion source 10 is more positively biased than the platen 260. Thus, the voltage supplied by the extraction power supply 170, referred to as the extraction voltage, determines the energy of the ions that are extracted from the IHC ion source 10. Further, the current supplied by the extraction power supply 170 is a measure of the total extracted beam current.

In certain embodiments, there is a feedback loop between the cathode bias power supply 115 and the extraction power supply 170. Specifically, it may be desirable to maintain the extracted beam current at a constant value. Thus, the current supplied from the extraction power supply 170 may be monitored and the output of the cathode bias power supply 115 may be adjusted to maintain a constant extraction current. This feedback loop may be performed by the controller 180, or may be performed in another manner.

A controller 180 may be in communication with one or more of the power supplies such that the voltage or current supplied by these power supplies may be monitored and/or modified. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein. For example, the controller 180 may be in communication with the cathode bias power supply 115 to allow the IHC ion source 10 to vary the voltage applied to the cathode relative to the filament 160. The controller 180 may also be in communication with the repeller power supply 123 to bias the repeller. Further, the controller 180 may be able to monitor the voltage, current and/or power supplied by the cathode bias power supply 115.

Figure 2:
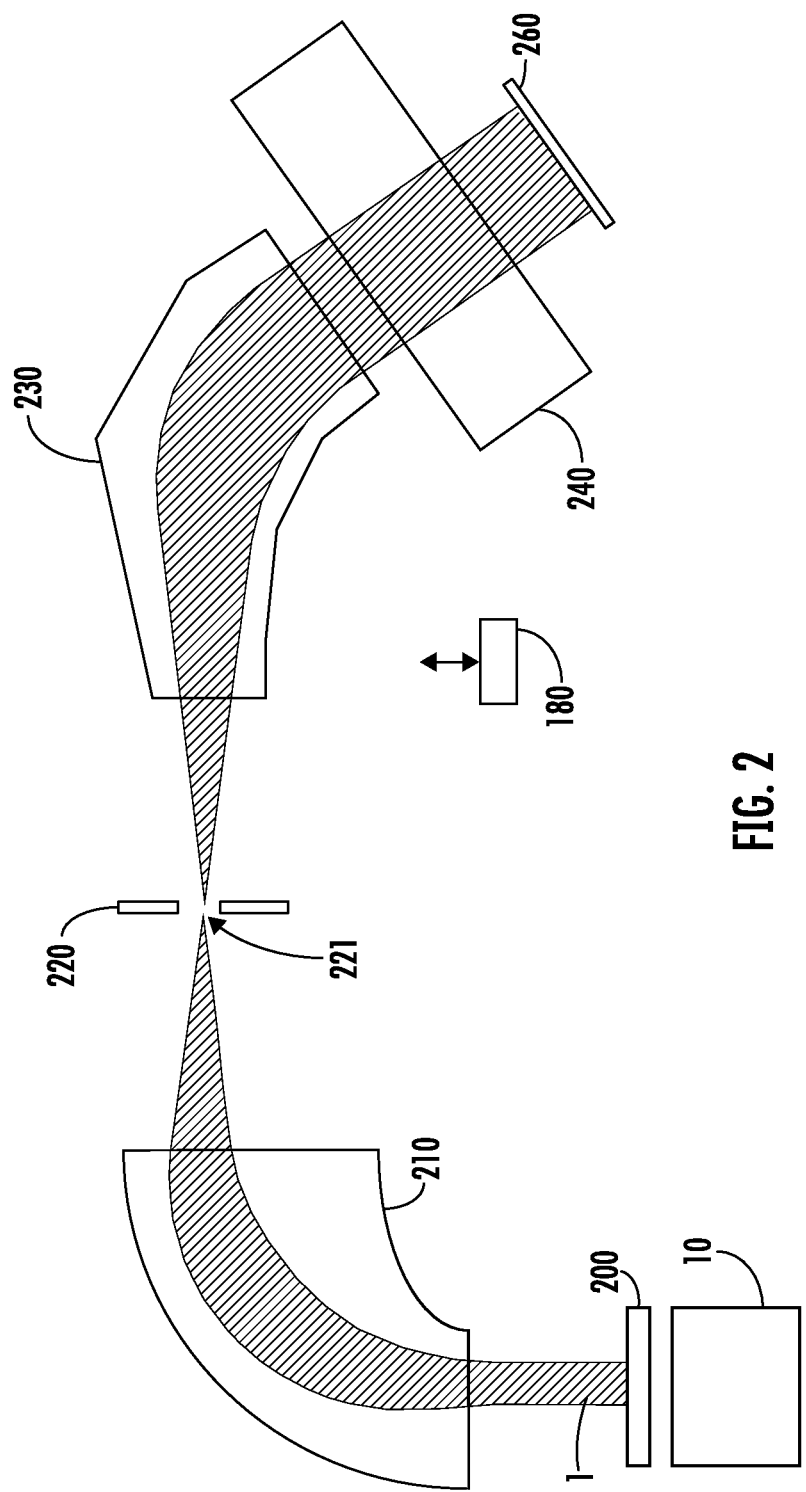
FIG. 2 is a block of an ion implantation system that uses the IHC ion source of FIG. 1.

FIG. 2 shows an ion implantation system using the IHC ion source 10 of FIG. 1. Disposed outside and proximate the extraction aperture of the IHC ion source 10 are one or more electrodes 200.

Located downstream from the electrodes 200 is a mass analyzer 210. The mass analyzer 210 uses magnetic fields to guide the path of the extracted ions 1. The magnetic fields affect the flight path of ions according to their mass and charge. A mass resolving device 220 that has a resolving aperture 221 is disposed at the output, or distal end, of the mass analyzer 210. By proper selection of the magnetic fields, only those ions 1 that have a selected mass and charge will be directed through the resolving aperture 221. Other ions will strike the mass resolving device 220 or a wall of the mass analyzer 210 and will not travel any further in the system.

A collimator 230 may disposed downstream from the mass resolving device 220. The collimator 230 accepts the ions 1 that pass through the resolving aperture 221 and creates a ribbon ion beam formed of a plurality of parallel or nearly parallel beamlets. The output, or distal end, of the mass analyzer 210 and the input, or proximal end, of the collimator 230 may be a fixed distance apart. The mass resolving device 220 is disposed in the space between these two components.

Located downstream from the collimator 230 may be an acceleration/deceleration stage 240. The acceleration/deceleration stage 240 may be referred to as an energy purity module. The energy purity module is a beam-line lens component configured to independently control deflection, deceleration, and focus of the ion beam. For example, the energy purity module may be a vertical electrostatic energy filter (VEEF) or electrostatic filter (EF). Located downstream from the acceleration/deceleration stage 240 is a platen 260. The workpiece is disposed on the platen 260 during processing.

As noted above, in certain embodiments, material from the repeller 120 may be deposited on the surface behind the repeller 120, which may be the second end 105 or the exposed surface of the liner 128. For example, positive ions may strike the outer edge of the repeller head 122, causing material to sputter from the repeller head 122. This material may be deposited on the second end 105 or liner 128. Alternatively, or additionally, fluorinated gasses, such as $BF_3$, may chemically react with the repeller head 122, facilitating the formation of $WF_6$. This gas may condense on the second end 105 or the liner 128, depositing tungsten on these surfaces.

Without being bound to a particular theory, it is believed that increasing the outer separation distance between the back surface of the repeller head 122 and the surface behind the repeller (i.e. the second end 105 or the exposed surface of the liner 128) along the outer edge of the repeller head 122 may reduce the possibility of shorting between the repeller head 122 and this surface. However, it may be advantageous to retain a smaller inner separation near the center of the repeller head 122.

Because there is an opening 127 disposed in the second end 105 aligned with the central axis of the repeller 120, the inner separation distance is measured between the back surface of the repeller head and the plane of the surface behind the repeller head, which may be the second end 105 or the exposed surface of the liner 128. Further, since the repeller stem 121 attaches to the repeller head at the central axis 338, the inner separation distance may be defined as the minimum distance between the back surface of the repeller head and the plane of the surface behind the repeller measured along the central axis. This smaller inner separation distance may help minimize the flow of gas that escapes through the opening 127. Further, it may be advantageous if there is a transition between the smaller inner separation distance and the outer separation distance.

Figure 3A:
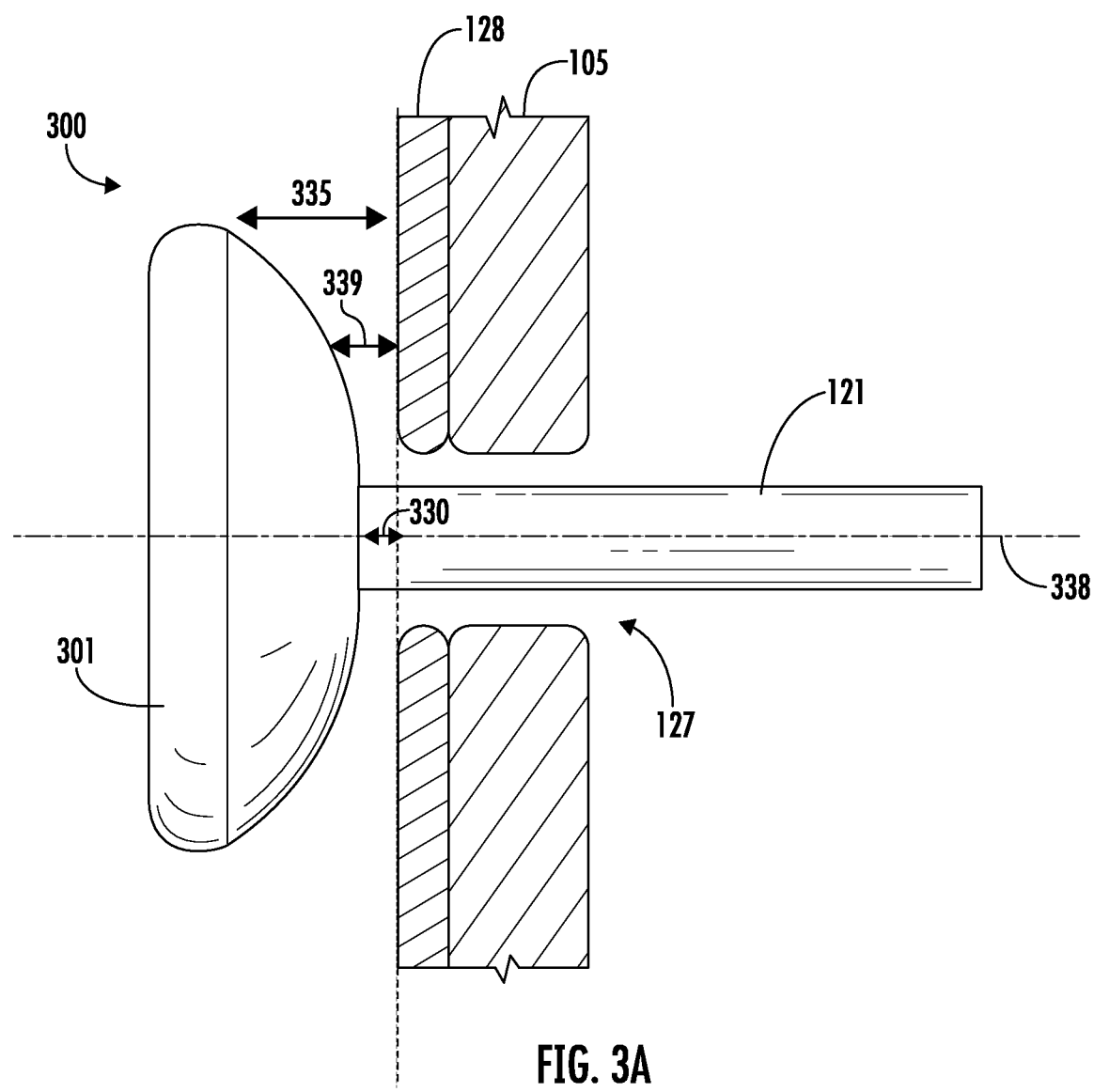
FIGS. 3A-3C shows a shaped repeller according to three different embodiments.
Figure 3B:
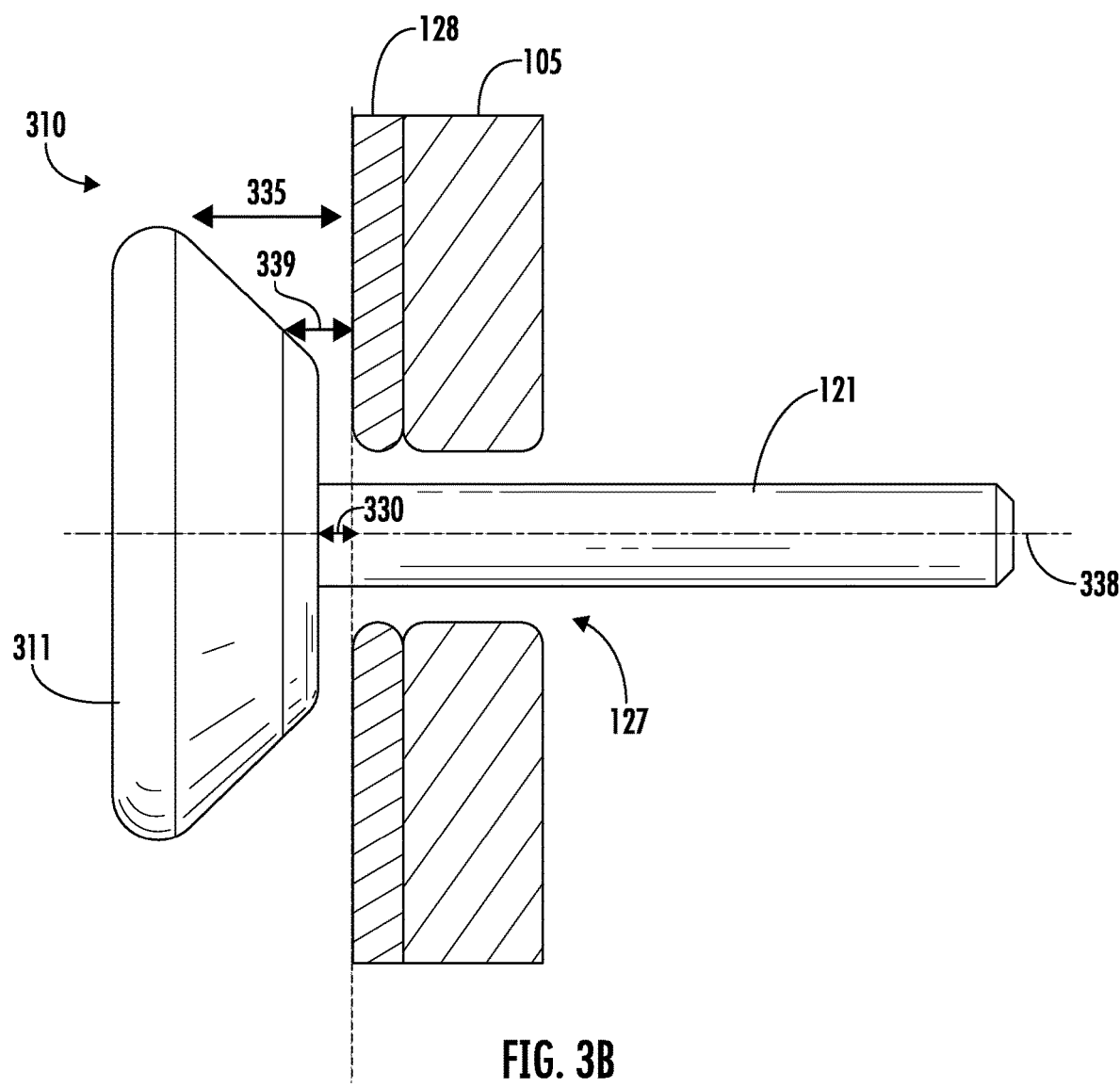
Figure 3C:
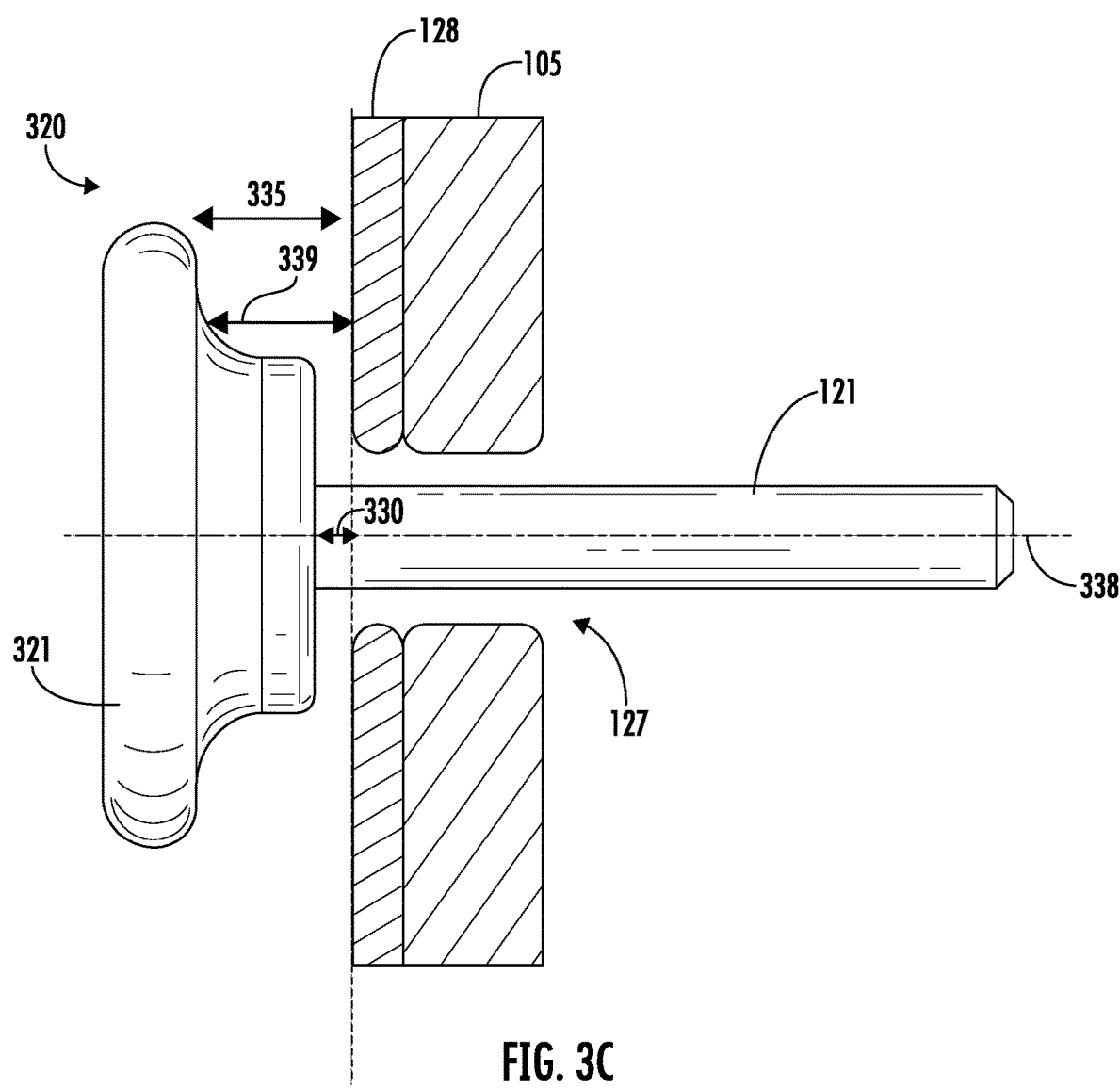

FIGS. 3A-3C each show a repeller design that has these attributes. In each of these embodiments, the repeller head may be cylindrical having a front surface and a shaped back surface. The cylinder may have a radius of between 0.3 and 0.6 inches, as measured from central axis 338. The central axis 338 passes through the center of the repeller head and the repeller stem 121.

Alternatively, the repeller head may have a different shape, such as a rectangular prism. In this case, the central axis of the repeller head is defined as the line passing from the front surface of the repeller head through the repeller stem that is equidistant from the midpoint of each edge of the rectangular repeller head.

In all embodiments, the back surface of the repeller head attaches to a repeller stem 121, which passes through the opening 127 in the second end 105. This attachment may be along the central axis 338 and may be a press fit, or the repeller head and repeller stem 121 may be a unitary part. The front surface of the repeller head may be flat, or another suitable shape, such as concave. The repeller head may have a thickness of between 0.125 and 0.300 inches as measured along the central axis 338, although other dimensions are possible. The repeller head is thinner at the outer edge. As noted above, in some embodiments, a liner 128 may be disposed against the second end 105, between the repeller head and the second end 105.

FIG. 3A shows a first shaped repeller 300. In this embodiment, the back surface of the repeller head 301 is convex, such that the back surface has a dome shape. The curvature of the back surface may have a radius of between 0.250 and 0.350 inches, depending on the radius of the repeller head and the desired height of the dome. At the center of the repeller head 301, which aligns with the central axis 338, there is an inner separation distance 330. This inner separation distance 330 is the minimum separation distance between the back surface of the repeller head 301 and the surface behind the repeller head. At the outer edge of the repeller head 301, there is an outer separation distance 335 between the repeller head 301 and the surface behind the repeller head 301. In certain embodiments, the maximum thickness of the repeller head 301, which is along the central axis 338, may be between 0.200 and 0.300 inches.

FIG. 3B shows a second shaped repeller 310. In this embodiment, the back surface of the repeller head 311 is tapered, such that the radius of the repeller head, as measured from the central axis 338, increases moving away from the repeller stem 121. The rate of increase may be linear, as shown in FIG. 3B. For example, the slope of the taper may be defined as the difference between the outer separation distance and the inner separation distance divided by one half of the radius of the repeller head 311. This calculation assumes that there is a portion of the repeller head 311 wherein the inner separation distance is constant from the central axis 338 outward to a distance equal to one half of the radius of the repeller head 311. If the size of the portion of the repeller head 311 having the inner separation distance is different, the calculation above is modified accordingly. While FIG. 3B shows a linear slope, the rate of increase may not be linear.

FIG. 3C shows a third shaped repeller 320. In this embodiment, there are one or more steps on the back surface of the repeller head 321, defining two or more separation distances. For example, for radii less than a first value, there may be a first separation distance. For radii greater than the first value and less than a second value, there may be a second separation distance, greater than the first separation distance. For example, FIG. 3C shows that for radii smaller than a certain value, the first separation distance is equal to the inner separation distance 330. For radii that are larger than the first value, the second separation distance may be equal to the outer separation distance. Note that while one step is shown in FIG. 3C, an arbitrary number of steps may be used. For example, there may be an additional step so that a portion of the repeller head is at a separation distance that is a value between the inner separation distance and the outer separation distance.

The inner separation distance may define the minimum separation between the repeller head and the surface behind the repeller head. This minimum separation distance may exist in the region adjacent to the repeller stem 121. In this way, the gas that travels along the path from the interior of the chamber to the opening 127 passes through a pathway having this inner separation distance. This increases the resistance of this pathway, reducing the amount of gas that escapes through the opening 127. In certain embodiments, the inner separation distance is no greater than the width of the gap between the repeller stem and the inner diameter of the opening 127. Thus, if there is a gap of 0.050 inches between the outer edge of the repeller stem 121 and the inner diameter of the opening 127 as the repeller stem passes through the opening 127, the inner separation distance may also be 0.050 inches or less. In other embodiments, the gap may be less than 0.075 inches and the inner separation distance may also be 0.075 inches or less.

In certain embodiments, the difference between the outer separation distance and the inner separation distance may be at least 0.100 inches. For example, if as described above, the inner separation distance is 0.050 inches, the outer separation distance may be at least 0.150 inches. In other embodiments, the difference between the outer separation distance and the inner separation distance may be at least 0.150 inches. In this embodiment, if the inner separation distance is 0.050 inches, the outer separation distance may be at least 0.200 inches.

In certain embodiments, the difference between the outer separation distance and the inner separation distance may be expressed as a ratio. For example, the ratio of the outer separation distance to the inner separation distance may be at least 3. In certain embodiments, the ratio may be at least 4.

In certain embodiments, the contour of the back surface as it transitions from the inner separation distance to the outer separation distance may be created to optimize the lifetime of the repeller. For example, in one embodiment, the back surface may be devoid of any sharp edges. A sharp edge is defined as a line where two planes meet. By rounding these edges, the propensity to arc may be reduced.

In certain embodiments, the rate at which the back surface transitions from the inner separation distance to the outer separation distance may help improve the lifetime of the repeller. For example, in certain embodiments, the separation distance measured at a distance equal to the midpoint between the outer edge of the repeller head and the outer edge of opening 127, may be referred to as the middle separation distance 339. In certain embodiments, the middle separation distance 339 may be greater than the inner separation distance 330. In some embodiments, the middle separation distance 339 may be at least 0.035 inches greater than the inner separation distance 330. In some embodiments, the middle separation distance 339 may be at least 75% greater than the inner separation distance 330. In other embodiments, the middle separation distance 339 may be at least twice the inner separation distance 330.

The present system and method have many advantages. Typically, IHC ion sources typically fail due to electrical shorting between the walls of the chamber and the repeller. This occurs due to the flaking of material previously deposited on the chamber walls. As the material begins to flake, the flake contacts the repeller head and the chamber wall simultaneously. In one test using a fluorinated gas, such as $BF_3$, the repeller electrically shorted to the chamber wall in less than 300 hours. However, when the shaped repeller head, such as that shown in FIG. 3A, was employed, the ion source was operated more than 50% longer without the repeller head electrically shorting. Further, in certain embodiments, repeller heads typically erode faster in the center, near the central axis 338, than along the outer edges. Thus, by having a repeller head where the thickness along the central axis is greater than that near the outer edges, the lifetime of the repeller head may be increased.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:
   a chamber comprising a plurality of walls;
   a cathode disposed on one end of the chamber;
   a repeller disposed on a second end of the chamber, the repeller comprising a repeller stem passing through an opening in the second end, and a repeller head disposed within the chamber and attached to the repeller stem;
   wherein a back surface of the repeller head has a dome shape.

2. The ion source of claim 1, wherein a minimum distance between the back surface and a surface behind the repeller head is 0.05 inches or less.

3. The ion source of claim 1, wherein an outer separation distance between the back surface of the repeller head and a surface behind the repeller head measured along an outer edge of the repeller head is greater than a minimum distance by at least 0.100 inches.

4. The ion source of claim 3, wherein the outer separation distance is greater than the minimum distance by at least 0.150 inches.

5. The ion source of claim 3, wherein a liner is disposed between the repeller head and the second end, and the minimum distance and the outer separation distance are measured from the back surface of the repeller head to an exposed surface of the liner.

6. The ion source of claim 1, wherein a gap is defined between the repeller stem and the opening, and wherein a minimum distance between the back surface and a surface behind the repeller head is less than or equal to a width of the gap.

7. The ion source of claim 1, wherein a middle separation distance is defined as a distance between a back surface of the repeller head and a surface behind the repeller head at a location that is a midpoint between an outer edge of the repeller head and an outer edge of the opening; and wherein the middle separation distance is at least 75% greater than a minimum distance between the back surface of the repeller head and the surface behind the repeller head.

8. An ion source, comprising:
   a chamber comprising a plurality of walls;
   a cathode disposed on one end of the chamber;
   a repeller disposed on a second end of the chamber, the repeller comprising a repeller stem passing through an opening in the second end, and a repeller head disposed within the chamber and attached to the repeller stem;
   wherein a back surface of the repeller head is shaped such that an outer separation distance between the back surface of the repeller head and a surface behind the repeller head measured along an outer edge of the repeller head is greater than an inner separation distance between the back surface of the repeller head and the surface behind the repeller head measured at a center of the repeller head.

9. The ion source of claim 8, wherein the back surface is tapered.

10. The ion source of claim 8, wherein the back surface is stepped.

11. The ion source of claim 8, wherein the back surface is dome shaped.

12. The ion source of claim 8, wherein the outer separation distance is at least 0.100 inches greater than the inner separation distance.

13. The ion source of claim 8, wherein the outer separation distance is at least 0.150 inches greater than the inner separation distance.

14. The ion source of claim 8, wherein a liner is disposed between the repeller head and the second end, and the inner separation distance and the outer separation distance are measured from the back surface of the repeller head to an exposed surface of the liner.

15. The ion source of claim 8, wherein the inner separation distance is a minimum distance between the back surface of the repeller head and the surface behind the repeller head.

16. The ion source of claim 8, wherein a gap is defined between the repeller stem and the opening, and wherein the inner separation distance is less than or equal to a width of the gap.

17. The ion source of claim 8, wherein a middle separation distance is defined as a distance between the back surface of the repeller head and the surface behind the repeller head at a location that is a midpoint between the outer edge of the repeller head and an outer edge of the opening; and
   wherein the middle separation distance is at least 75% greater than the inner separation distance.

18. A repeller for use in an indirectly heated cathode (IHC) ion source, comprising:
   a repeller stem; and
   a repeller head having a diameter larger than the repeller stem, and attached to the repeller stem;
   wherein a back surface of the repeller head has a dome shape.

* * * * *